United States Patent [19]

Jambotkar

[11] Patent Number: 4,935,797
[45] Date of Patent: Jun. 19, 1990

[54] HETEROJUNCTION BIPOLAR TRANSISTORS

[75] Inventor: Chakrapani G. Jambotkar, Hopewell Junction, N.Y.

[73] Assignee: International Business Machines Corporation, Armonk, N.Y.

[21] Appl. No.: 264,428

[22] Filed: Oct. 31, 1988

[51] Int. Cl.$^5$ .............................................. H01L 29/72
[52] U.S. Cl. ........................................ 357/34; 357/16; 357/52; 357/55; 357/68
[58] Field of Search ...................... 357/16, 34, 52, 55, 357/68

[56] References Cited

U.S. PATENT DOCUMENTS 4,379,005  4/1983  Hovel et al. .......................... 357/34

OTHER PUBLICATIONS

IEEE Electron Device Letters, vol. EDL-7, No. 12, Dec. 1986, pp. 694–696, "Emitter-Base-Collector Self-Aligned Heterojunction Bipolar Transistors Using Wet Etching Process"–EDA et al.
IEEE Electron Device Letters, vol. EDL-7, No. 11, Nov. 1986, pp. 615–617, "A Fully Planar Heterojunction Bipolar Transistor" by Tully et al.
1985 IEEE IEDM Proceedings, pp. 328–331, "AlGaAs/GaAs Heterojunction Bipolar Transistors" by Izawa et al.

Primary Examiner—Edward J. Wojciechowicz

[57] ABSTRACT

Heterojunction bipolar transistor technology employing in a body wherein a larger area base electrode over a buried electrode has above it a smaller area electrode, an overhang capability on the portion of the smaller area electrode that operates to mask the base layer in converting the extrinsic portion to high conductivity and assists lift-off of base contact metal such that the base contact metal is in extremely close proximity to the smaller area electrode.

10 Claims, 6 Drawing Sheets

HETEROJUNCTION BIPOLAR TRANSISTORS

DESCRIPTION

The invention is directed to heterojunction bipolar type transistors that provide higher performance, higher miniaturization and higher device integration.

CROSS REFERENCE TO RELATED APPLICATION

Reference is made to application Ser. No. 238,830 filed 08/31/88 for related bipolar transistor integrated circuit technology.

BACKGROUND OF THE INVENTION

As progress toward higher frequency performance, higher miniaturization and higher device integration takes place in bipolar transistor technology, the design of the transistor so as to improve one parameter frequently results in the deterioration of another parameter.

This is particularly the case in heterojunction bipolar transistors that are fabricated in arrays in superimposed layers in compound semiconductor materials where desirable device structural features are frequently limited both in attainability and in reproducibility by the processing techniques involved in the fabrication. In structures of this type limitations in the ability to achieve precision in the processing operations of erosion of materials and positioning of deposited materials necessitates tradeoffs due t in accommodating these limitations which interfere with performance, miniaturization and reproducibility. The structure of the device and the materials from which it is made are of importance in the ability to fabricate it reproducibly.

BACKGROUND ART

Three heterojunction bipolar transistor structures and related methods have been reported in the literature that are capable of providing high performance. All three structures use an epitaxial emitter on broader area layers that, in subsequent shaping and property conversion, are arranged as base and collector electrodes of the device.

In the structure and method described in the 1985 1 IEEE IEDM Proceedings, pages 328-331, an AlGaAs/GaAs heterojunction bipolar transistor is described. Here an epitaxial N-AlGaAs-N+GaAs emitter is formed on a broad area P+AlGaAs base region, the sides of the emitter being covered by a sidewall insulation which operates to align the base contact members. Extreme care in fabrication is required in order to perform a base metal lift-off repeatedly without creation of short circuits. Further, extreme care is also required in etching operations conducted with an etch that does not have a natural stop.

In the structure and method described in IEEE Electron Device Letters, Vol. EDL-7, No. 11, November 1986, pages 615 to 617, the emitter contact is positioned inside the epitaxial emitter electrode in an alignment dependent operation. Such a structure, requiring accommodation of tolerances for limitations in precision of alignment, necessitates that the emitter area be large. This, in turn, results in a large intrinsic resistance for the base region. Under these conditions, the emitter-base and collector-base capacitances are also large in such a structure.

In the structure and method described in the 1986 IEEE Electron Device Letters, Vol. EDL-7, No. 12, December 1986, pages 694-696, AuGe was used as a wet etching resist and also as an emitter contact, and an overhang of the emitter contact serves as a base contact proximity control in a base contact deposition. There are four limitations in this structure and method that may affect reproducibility and performance. Au alloys require great care in etching. There is difficulty in controlling the wet etching of the GaAs 1000 A, AlGaAs 2000 A thickness and stopping at the 1000 A thick P GaAs layer. The base, as shown, does not provide for conversion of the extrinsic part of the base area to high conductivity for minimization of base resistance. If such a P+ extrinsic base modification were attempted via ion implantation, subsequent implant annealing would not be possible because of a temperature constraint imposed by the presence of the AuGe alloy. Finally, the emitter would have to be large enough to accommodate the limits in depositing interconnecting wiring when conventional insulation and etching of contact holes are used.

As the art is progressing, it is becoming essential for device performance that the electrical device parameters of resistance and capacitance be as small as possible and the process parameters be employed so as to employ natural stops and residue avoidance techniques.

SUMMARY OF THE INVENTION

The invention provides control over the resistance of each of the emitter, base and collector regions and then over the area of the emitter-base and collector-base junctions by establishing for the junction area of the upper or emitter electrode the design area for the device being built. The remaining area of the layer in which the base electrode is positioned is converted to high conductivity.

BRIEF DESCRIPTION OF THE DRAWINGS

FIG. 1 is an illustration of the starting substrate with certain epitaxial layers thereon.

FIGS. 2, 3 and 4 are illustrations of a resist, the epitaxial layers and the final shape, respectively, formed in the fabrication of the trapezoidal overhang emitter.

FIG. 5 is an illustration of the base implantation and base contact alignment control provided by the trapezoidal overhang emitter.

FIG. 6 is an illustration of the formation of a collector contact and isolation regions.

FIG. 7 is an illustration of base contact metallization location controlled by the trapezoidal overhang emitter.

FIG. 8 is an illustration of the application of passivation and planarization layers.

FIG. 9 is an illustration of the top of the trapezoidal emitter overhang function of establishing a planar metallization location.

FIG. 10 is an illustration of the completed heterojunction bipolar transistor structure.

FIG. 11 is the layered starting material.

FIGS. 12 and 13 are illustrations of intermediate structures formed in the growth of the emitter structure.

FIGS. 14 and 15 are illustrations of intermediate structures formed in the sidewall deposited overhang emitter structure.

FIG. 16 is an illustration of the formation of the extrinsic base region, the collector contact and the isolation regions.

FIG. 17 is an illustration of the base contact and planarization guide metallization.

FIG. 18 is an illustration of the planarization and insulation layers.

FIG. 19 is an illustration of the completed heterojunction bipolar transistor.

FIG. 20 is the layered starting material.

FIGS. 21 and 22 are illustrations of intermediate structures in the formation of the top deposited emitter structure.

FIG. 23 is an illustration of the extrinsic base region, the collector contact and the isolation regions.

FIG. 24 is an illustration of the metallization of the extrinsic base contacts and planarization guide.

FIGS. 25, 26 and 27 are illustrations of intermediate structures formed in the planarization of the structure.

FIG. 28 is an illustration of the completed heterojunction bipolar structure.

DESCRIPTION OF THE INVENTION

Figure 1:
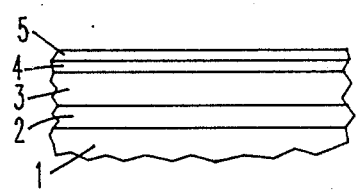
FIGS. 1 to 10 are illustrations of intermediate and final structures formed in a trapezoidal overhang emitter fabrication of the heterojunction bipolar transistor of the invention.

Since at the present state of the art integrated circuit technology employing heterojunction bipolar transistors most commonly involves a buried collector and an exposed emitter, that construction is described. However, in the light of the principles set forth, it will be apparent to one skilled in the art that the roles of the emitter and collector may be reversed.

In an integrated circuit, it is essential that there be provision not only for high performance and high miniaturization in the final structure but also for fabrication capability in the intermediate structures.

The structural principles of the invention involve: an emitter electrode superimposed on a base electrode in turn superimposed on a collector electrode wherein the emitter forms a junction with the base and has the features that the emitter-base junction area is the designed area for the transistor device being built, the emitter has associated with it an overhang capability above and separated from the emitterbase junction that extends laterally to coincide with the extrinsic portion of the layer in which the base is positioned and having a ledge between sidewall and top, the intrinsic portion of the base layer is confined between the emitter-base and collector-base junction areas and the extrinsic portion of the base layer is highly conductive, a planarizing insulation layer extends to a height established by the top of the emitter overhang capability, and the base contact has two parts, a first portion being on the extrinsic base and a second portion on the isolation region.

The structural principles have several manufacturing related aspects. The emitter overhang first serves as an implantation mask that permits conversion to high conductivity of that portion of the base layer which is outside the area of the emitter junction. The overhanging portion next serves to provide a "lift-off" ledge operable as a reliable and reproducible separation point so that a metal contact can be made to the extrinsic base in extremely close proximity to the emitter. The metal residing on the overhang thereafter serves as a guide in planarization of the insulation which establishes a level for support of global wiring connected to the collector and base through reachthrough contacts.

BEST MODE OF CARRYING OUT THE INVENTION

The features of the invention are described in connection with the fabrication of three different heterojunction bipolar structures.

The first, described in connection with FIGS. 1–10, employs a trapezoidal overhang emitter.

The second, described in connection with FIGS. 11–19, employs a sidewall deposited overhang emitter, and The third, described in connection with FIGS. 20–28, employs a top deposited overhang emitter.

In addition to reference numerals in the figures, there is also provided an illustrative material and conductivity designation to assist in following the description. It will further be apparent to one skilled in the art that elements shown separate in the cross section of a two-dimensional sketch will in fact be a single element in the third dimension of the structure.

Referring to FIG. 1, there is first provided a compound semiconductor structure made up of superimposed collector and base layers on a supporting substrate with buffer layers as is standard in the art. The structure of FIG. 1 is grown of successive layers using the Molecular Beam Epitaxy (MBE) or Metal Organic Chemical Vapor Deposition (MOCVD) types of techniques also standard in the art.

On a semi-insulating (SI) GaAs substrate 1, a buffer layer of GaAs of the order of 0.5 microns in thickness is grown to reduce the effect of defects in the substrate 1. On the buffer layer 2, a layer of $n^+$ GaAs 3 of the order of 0.5 to 1 micron in thickness is grown. On the layer 3, a layer of n AlGaAs 4 approximately 0.2 microns in thickness is grown and on the layer 4, a layer 5 of P conductivity type GaAs approximately 0.15 microns in thickness is grown.

Figure 3:
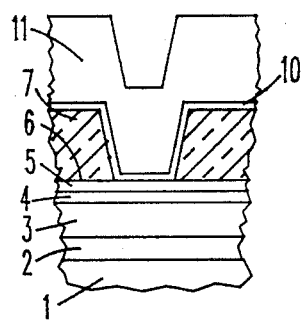
Figure 2:
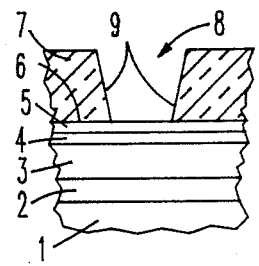
Figure 4:
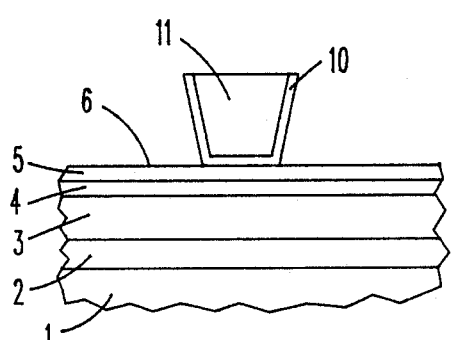

Referring next to FIGS. 2, 3 and 4, the trapezoidal overhang emitter structure and fabrication will be described. At this point, in FIG. 2, in accordance with the invention, on a layer 7 of $SiO_2$ deposited on the surface 6 of layer 5 an opening 8 is formed where the exposed portion of the surface 6 will be the size for the designed electrical characteristics of the device being built. The layer 7 is approximately 3500 Angstroms thick and the sidewalls 9 of the opening 8 are provided with a slope of about 60°. Such a slope may be obtained by producing first a similar slope in an overlying photoresist used for the lithography and then reflowing the resist at an elevated temperature after the resist has been developed.

The slope in the resist can then be reproduced in the underlying oxide layer 7 through $CF_4$ reactive ion etching which etches both the resist and the silicon dioxide at about the same rate. The parameters of the formation of the opening are arranged so that the area of exposure of the surface 6 at the bottom of the opening 8 is the designed emitter area of the device.

Continuing in connection with FIG. 3, a layer 10 of n-AlGaAs approximately 0.1 micron thick is grown epitaxially on the surface 6 and over the layer 7. Thereafter, on the layer 10, a layer of n+-GaAs 11 approximately 0.4 microns thick is grown epitaxially and conformally over the layer 10.

Referring next to FIG. 4, employing such techniques as chemical/mechanical polishing, ion milling or reactive ion etching, the portions of layers 11 and 10 above layer 7 are removed. Especially when ion milling or reactive ion etching is used, a planarizing material such as polyimide may first be coated. Following removal of layers 11 and 10 above $SiO_2$ layer 7, the layer 7 itself is removed using, for example, buffered HF acid. The structure of FIG. 4 results after this operation. A trapezoidal overhang emitter is epitaxial with an forms an emitter-base junction with the layer 5 at the portion of the surface 6 that was the opening 8 in the layer 7 before removal.

Figure 5:
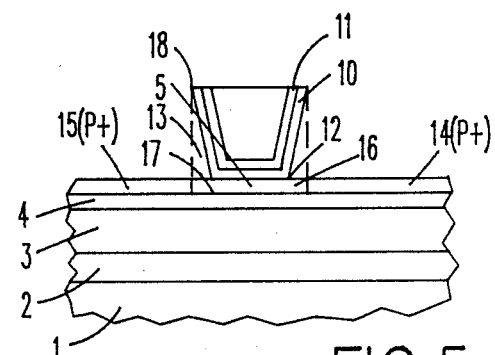

Referring next to FIG. 5, a schematic illustration of the features of the trapezoidal overhang emitter are shown. In FIG. 5, in addition to the emitter-base junction 12 being the designed area, the overhang 13 permits a vertical impurity introduction operation via ion implantation to convert the regions 14 and 15 of the layer 5 to high conductivity, shown as P+, using for example magnesium as an impurity, to a location 16 proximate to but separated by about 0.2 microns from the emitter-base junction 12.

Additional advantages achieved with the trapezoidal overhang emitter of FIG. 5 are that a sharp ledge 18 is provided by the trapezoidal shape which serves in future lift-off metallization operations to provide a clear separation and that the height of the emitter which is used in later planarization operations is established by the simple and controllable thickness of the layer 7 applied in FIG. 2.

Where the vertical impurity introduction operation is the ion implantation technique well known in the art, the annealing operation is performed at this point in the fabrication with minimal deleterious effect on critical dimensions and impurity distributions.

In FIGS. 6 to 10 the metallization and isolation of the device are described.

Figure 6:
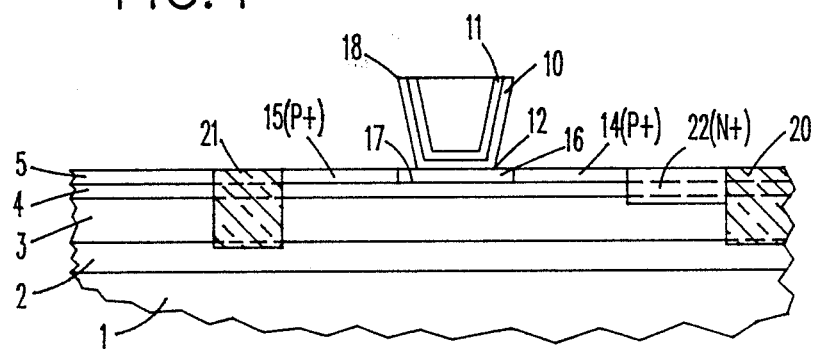

In FIG. 6, the structure is shown with isolation regions 20 and 21 and collector contact 22 formed using standard lithographic techniques. Boron ion implantation may be used for elements 20 and 21. When ion implantation techniques are used, it is frequently possible to combine all annealing for the extrinsic base regions 14 and 15, the isolation 20 and 21 and the collector contact reachthrough 22 in one temperature cycle.

Figure 7:
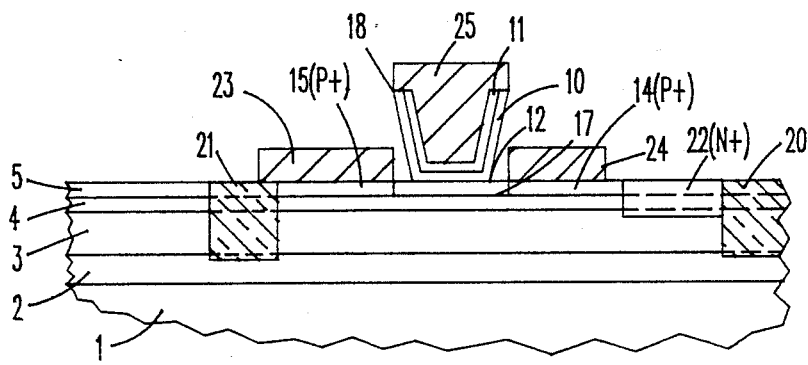

Referring next to FIG. 7, the formation of the portion of the base contact at the extrinsic base region and the planarization guide on the emitter are illustrated. Using appropriate lithography and lift-off well known in the art, the contact to the extrinsic base 23 and 24 and the metal cover for the emitter 25 are applied using about a 0.2 micron thick layer of Au/Mn as an example. In accordance with the invention, the trapezoidal overhang shape of the emitter terminates the lateral extent of the contact 23 and 24 to the extrinsic base, proximate to, but separated from, the emitter when the metal is deposited on the extrinsic base and the emitter. In the lift-off operation, the ledge 18 provides the desired clean separation of the metal into the base contact 23 and 24 and the emitter planarization guide 25. The base contact 23 and 24 can extend laterally as far away from the emitter as desired including as illustrated over a part of the isolation 21.

In accordance with the invention, the structure as completed in FIG. 7 provides advantages in facilitating contacting to array or global type wiring where the operation is generally broad area deposition.

Figure 8:
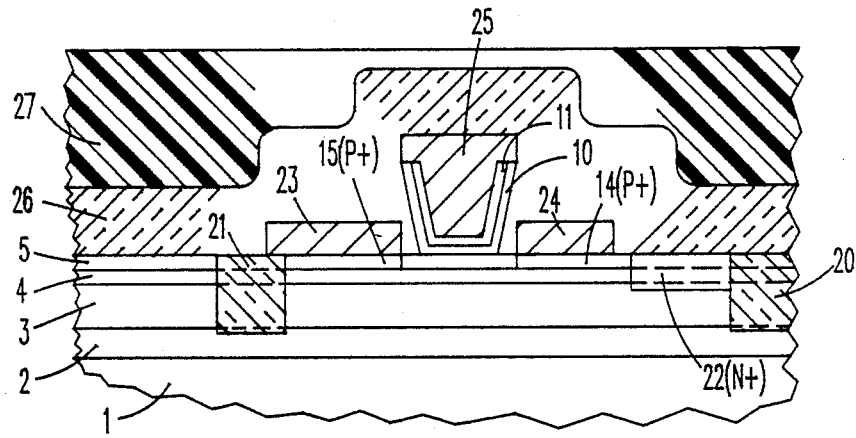

Referring next to FIG. 8, the combined insulation and planarization with a built-in planarization guide stop is illustrated. In FIG. 8, a layer 26 of silicon dioxide is conformally formed over the entire structure and thereover a layer 27 of a planarizing material such as polyimide is conformally placed, by coating, so as to reach a general level. The insulation layer 26 is chosen for its electrical insulating properties and for the common property with the planarizing material of both being erodible generally by etching at the generally same rate.

Figure 9:
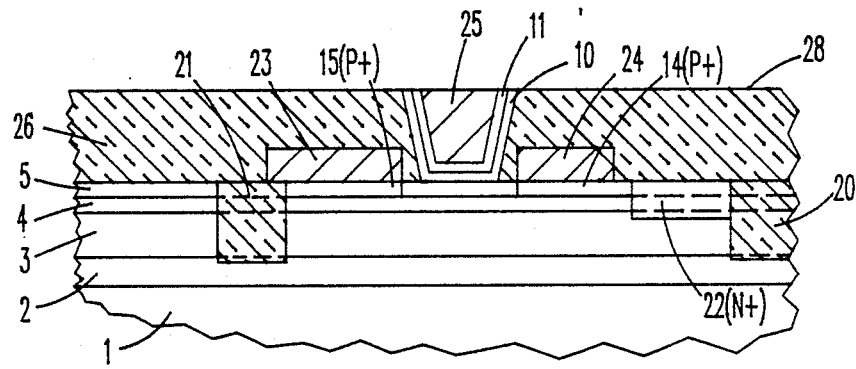

In FIG. 9 the structure is provided with a planar surface for the interconnection wiring. Referring to FIG. 9, through the standard techniques in the art of chemical and/or mechanical polishing, ion milling and sputter etching, the combined layers 26 and 27 are eroded to a planar level surface 28. In this operation, the element 25 serves as a guide in the erosion operation to establish level 28 at the top of the emitter.

Figure 10:
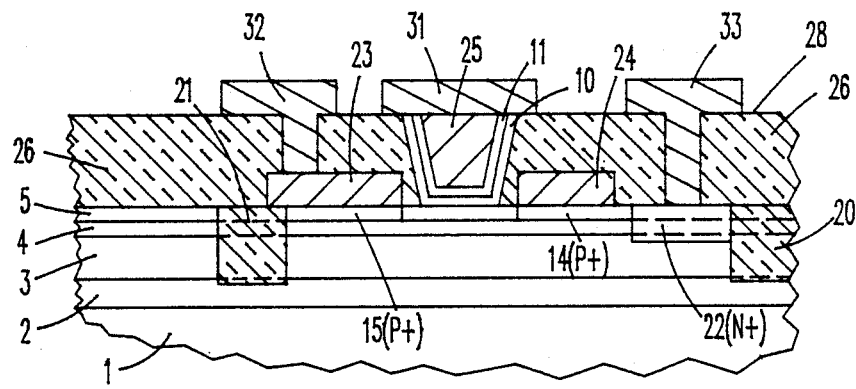

The completed device is shown in FIG. 10 wherein on the planar surface 28, using standard lithographic and etching techniques, contact reachthrough holes 29 and 30 are formed for the collector and base contacts, respectively, and thereafter through lithography and metal deposition, the emitter, base and collector global wiring contacts 31, 32 and 33, respectively, are formed. At this point, the simplicity and reliability of the global wiring is enhanced by the fact that the level 28 is at the emitter top, all contacts are on the same plane level 28 and the base contact 32 can be moved away from the emitter 31 since the location is given flexibility by the two-part 23 and 32 base contact structure.

Referring next to FIGS. 11 to 19 wherein the use of a side deposited overhang emitter structure is employed. The same reference numerals are used for elements that are in common with the earlier figures.

Figure 11:
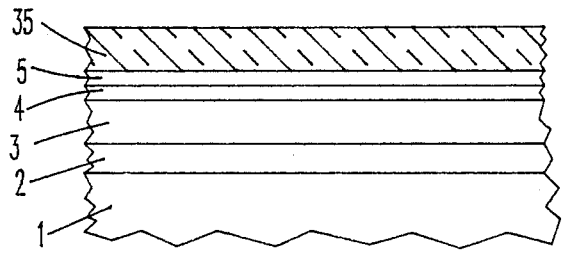
FIGS. 11 to 19 are illustrations of intermediate and final structures formed in a sidewall deposited emitter overhang fabrication of the heterojunction bipolar transistor of the invention.

In FIG. 11, a starting monocrystalline compound semiconductor body is employed that has layers 1 to 5 in common with the structure of FIG. 1. In FIG. 11 an approximately 3500 A thick layer 35 of $SiO_x$ is deposited.

Figure 12:
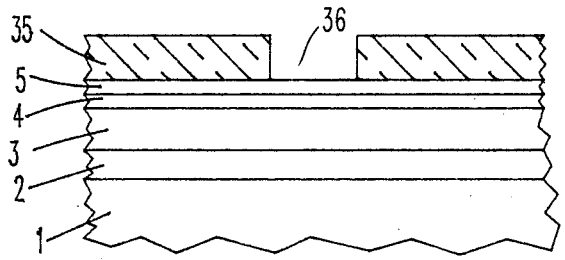

In FIG. 12 through lithography and reactive ion etching (RIE) using for example $CF_4$, a window 36 is opened having an area the size of the emitter-base junction area of the device to be fabricated.

Figure 13:
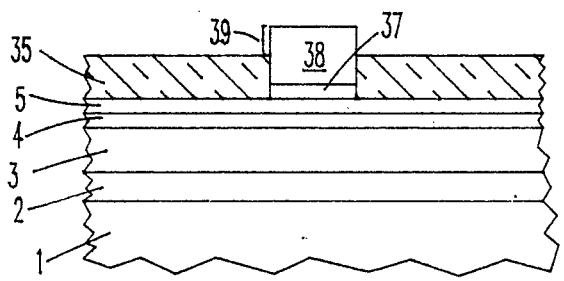

In the window 36, as illustrated in FIG. 13, a two layer emitter structure standard in the art is grown epitaxially on the exposed portion of layer 5. This is accomplished by using molecular beam epitaxy (MBE) and growing a first layer 37 of n-AlGaAs about 0.1 micron thick epitaxial with layer 5 followed by a second layer 38 of n-GaAs about 0.45 micron thick epitaxial with layer 37. The surface of the layer 35 is then eroded to expose sidewalls of the n-GaAs 38 to an overhang depth dimension 39, which is about 0.2 microns.

Figure 14:
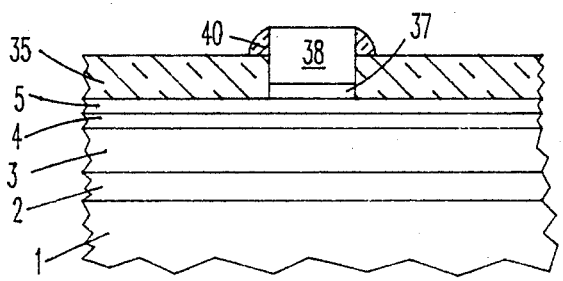

Through chemical vapor deposition $Si_xN_y$ is next placed on the surface of layer 35 to the thickness approximately of the dimension 39 and then through reactive ion etching (RIE) the $Si_xN_y$ is eroded from the surface leaving a sidewall deposited overhang member 40 as shown in FIG. 14.

Figure 15:
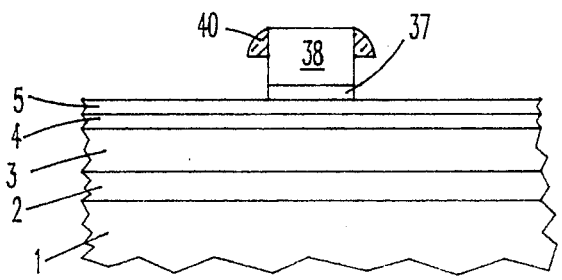

The $SiO_x$ layer 35 is next removed in its entirety using wet etching with buffered HF or isotropic plasma etching so that, as illustrated in FIG. 15, the emitter structure of epitaxial layers 37 and 38 with the sidewall deposited overhang 40 stands alone.

Figure 16:
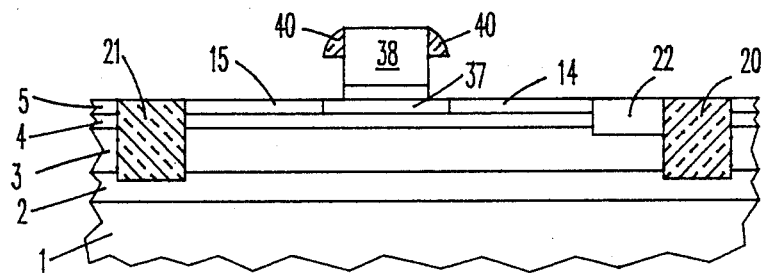

Referring to FIG. 16, the collector contact reachthrough through 22 is formed using a patterned layer of resist through which is implanted an n+ impurity such as silicon. Then using another patterned layer of photoresist as a mask, a P+ dopant such as Be or Mg is implanted to obtain the P+ extrinsic base regions 14 and 15, the overhang 40 serving to delineate the inside boundaries of regions 14 and 15 adjacent to the emitter. An annealing heat cycle is applied next to activate all implantations. Isolation implantations 20 and 21 using, for example, boron are then performed and annealed.

Figure 17:
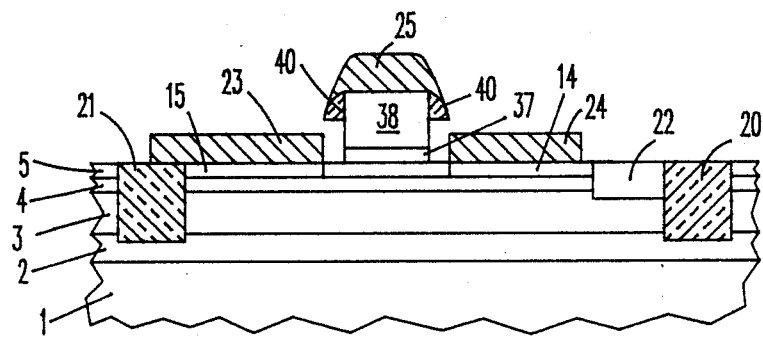

Referring next to FIG. 17, through the use of lithography metal evaporation and lift-off, a metallized layer of about 0.2 micron thick AuMn is applied followed by separation through lift-off, providing extrinsic base contacts 23 and 24 and planarizing guide 25. In the lift-off, the height of layers 37 and 38 and the ledge formed by the overhang 40 ensure clean separation of the metal layer.

Figure 18:
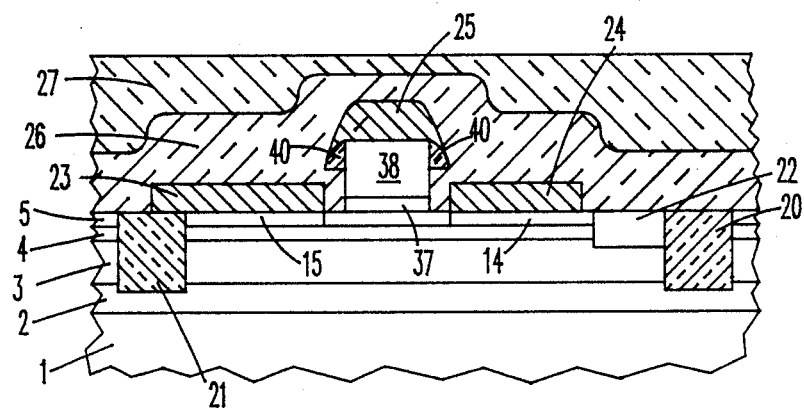

Referring next to FIG. 18, a layer 26 of insulation such as $SiO_x$ about 0.6 microns thick is deposited conformally over the structure by a technique such as chemical vapor deposition. The layer 26 is followed by a planarizing layer 27 of a material such as polyimide. The layers 26 and 27 are then etched back using RIE until the metal planarization guide 25 is exposed.

Through the use of chemical/mechanical polishing, ion milling or sputter etching, the metal 25, the $Si_xN_y$ overhang 40, the layer material of layers 26 and 27 and the top portion of layer 38 are etched back simultaneously in planar fashion. When the overhang 40 is removed, the layer 38 is reduced.

Figure 19:
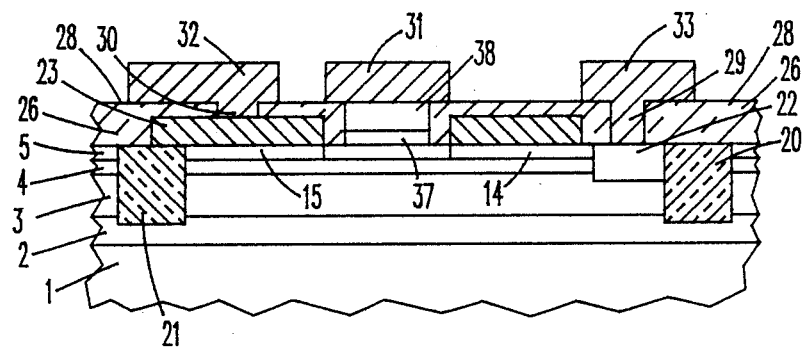

Referring to FIG. 19, the final structure is shown in which the results of the etch back produces a planar surface 28 through which contact holes 29 and 30 for the collector and base, respectively, are formed through lithography and RIE. Thereafter, using lithography and a metal deposition, such as AuGeNi, emitter, base and collector contacts 31, 32 and 33, respectively, are deposited and delineated through the lift-off technique. The resulting structure has all the advantages described in connection with FIG. 10.

In FIGS. 20 to 28, the invention is described in connection with a top deposited overhang emitter, the layers of which are grown as part of the starting wafer. For assistance in following the description, common reference numerals are the same and an exemplary material and conductivity assignment is made.

Figure 20:
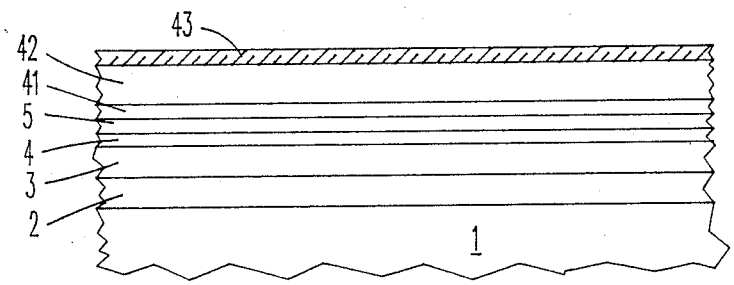
FIGS. 20 to 28 are illustrations of the intermediate and final structures formed in a top deposited overhang emitter fabrication of the heterojunction bipolar transistor of the invention.

In FIG. 20 a starting compound semiconductor multilayer crystal is grown using MOCVD or MBE in which there is grown serially on a semi-insulating GaAs substrate 1, a buffer layer 2 of GaAs approximately 0.5 micron thick, a subcollector layer 3 of n+-GaAs approximately 0.5 to 1 micron thick, a collector layer 4 of n-AlGaAs approximately 0.2 micron thick, a base layer 5 of P-GaAs approximately 0.15 micron thick, a first emitter layer 41 of n-AlGaAs approximately 0.1 micron thick and a second emitter layer 42 of n+-GaAs approximately 0.4 micron thick. A layer 43 of $SiO_x$ approximately 2500 A thick is deposited using chemical vapor deposition.

Figure 21:
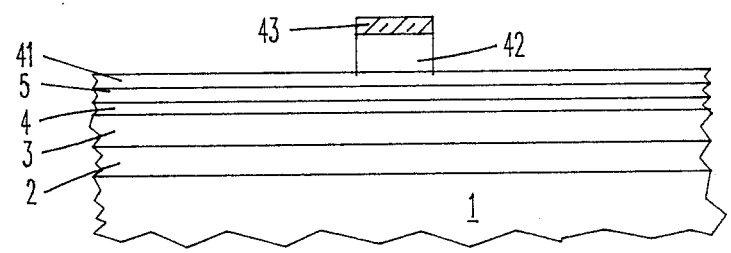

Referring to FIG. 21, the layers 42 and 43 are eroded to leave an island, the area of which is to be the design area of the emitter of the device being constructed. The erosion is accomplished using lithographically placed resist openings and RIE where $CF_4$ is used to etch the $SiO_x$ of layer 43 and $CCl_2F_2$-He is used in etching the n+ GaAs.

Figure 22:
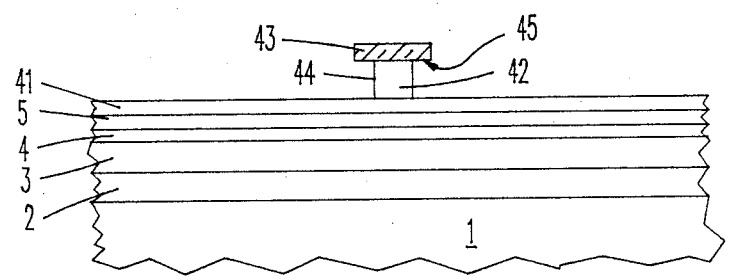

Referring next to FIG. 22, as the n+ GaAs layer 42 is being etched, an adjustment of the plasma conditions will cause the etching of the faces 44 to proceed more rapidly. An undercut 45 is thus formed with the layer 43 providing an overhang. An overhang of about 0.2 micron is achieved.

Figure 23:
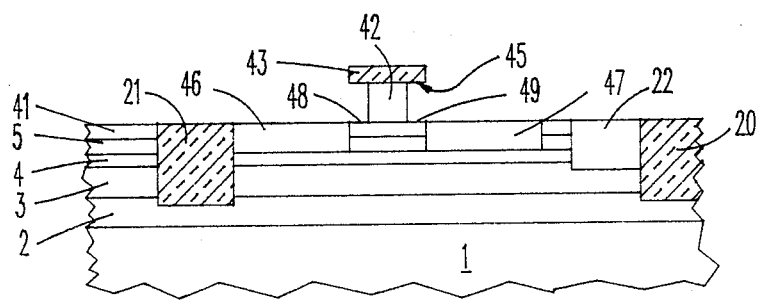

Referring next to FIG. 23, the formation of the extrinsic base region, the collector reachthrough and the isolation is illustrated. Through the use of a patterned layer of photoresist, not shown, and a multienergy ion implant of, for example, silicon, an n+ collector reachthrough 22 is provided.

Thereafter, through the use of a different patterned layer of photoresist, not shown, as a mask for the ion implantation of, for example, Be or Mg the extrinsic P+ regions 46 and 47 are formed. The implant converts both the layer 41 and the base layer down to the collector layer 4. The layer 43 with the overhang 45 serves as a mask to delineate the edges 48 and 49 of the P+ extrinsic base region portions 46 and 47.

It is desirable in the final structure that the edges 48 and 49 be situated such that the metal contact to be subsequently applied to the extrinsic base portions does not extend beyond edges 48 and 49. This is accomplished through the diffusion of the P+ impurity in a heat cycle either separate from or part of the ion implantation activation that moves the edges 48 and 49 laterally toward the emitter. The movement is of about 0.1 micron, or about half of the 0.2 micron overhang is achieved. Wafer tilting during implantation could alternatively produce the same desired result.

After annealing of the extrinsic base implantation, a further masking and implantation with, for example, boron is employed to produce the isolation regions 20 and 21 which are in turn annealed.

Figure 24:
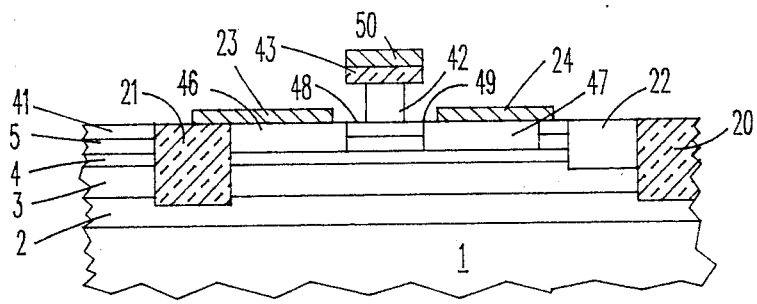

Referring next to FIG. 24, metal contacts are provided to the extrinsic base regions 46 and 47 and simultaneously to the layer 43 to serve as a planarization guide. This is attained through the use of lift-off lithography and deposition of a metal such as AuMn which is about 0.25 micron in thickness. In the lift-off operation, the metal will separate cleanly at the ledge of the overhang 45 and the height of layer 42. The resulting structure has extrinsic base contacts 23 and 24 and planarization guide 50 in place, extrinsic base edges 48 and 49 having moved in the direction of the emitter in the heat cycles earlier.

Figure 25:
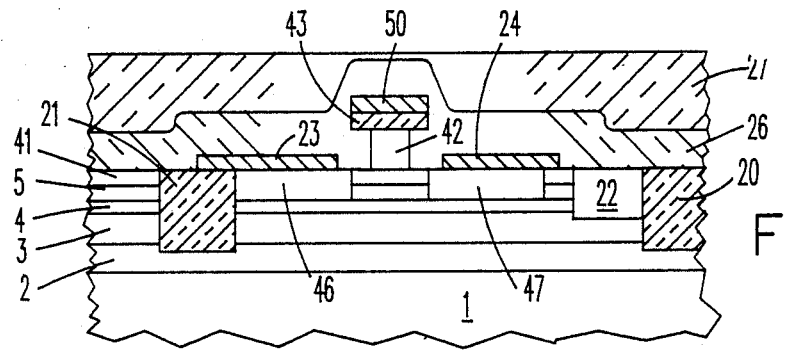

In FIG. 25, an insulating layer 26 of chemically vapor deposited $SiO_x$, about 5000 Å thick, is applied followed by a conformal coating 27 of a planarizing material such as polyimide.

Figure 26:
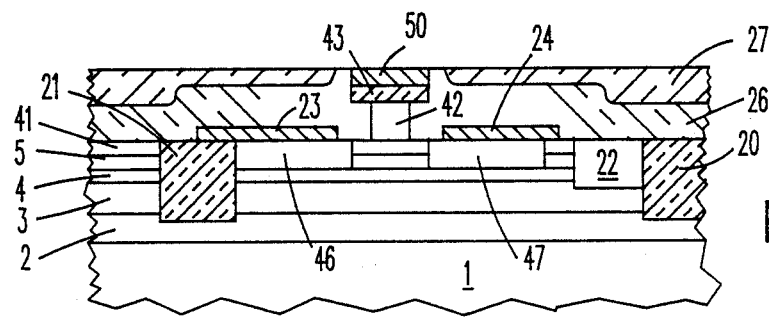

In FIG. 26, through the use of RIE using, for example, $CF_4$ which will etch layers 27 and 26 at practically the same rate, the structure is etched back until the planarization guide 50 metal just exposes.

The planarization guide 50 provides an indication so that a change in erosion technique can be employed that will permit removal of the guide 50 and the layer 43 under it down to the top of the emitter layer 42. The structure is illustrated in FIG. 27 wherein the insulating layer 26 now has a surface 51 flush with the emitter layer 42 that provides a planar surface for global interconnecting wiring.

Figure 27:
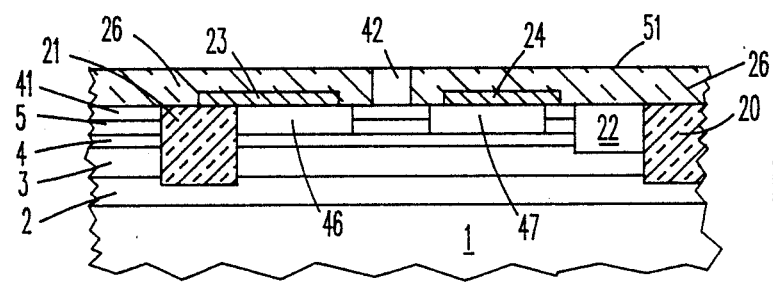
Figure 28:
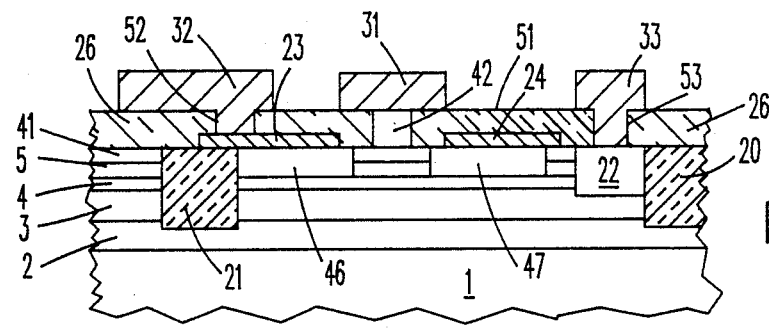

It is possible if sufficient control is present to use the same erosion technique for the entire etch back from the structure of FIG. 25 to that of FIG. 27. Chemical/mechanical polishing, sputter etching or ion milling may be used in the removal of the metal planarization guide 50 and layer 43.

Through the use of lithography and a RIE etch with CF$_4$, openings 52 and 53 for base and collector contacts are next made and thereafter the emitter, base and collector contacts 31, 32, 33, respectively, are deposited. A sintering heat cycle for metal alloying is then performed producing the structure of FIG. 28.

What has been described is a heterojunction bipolar transistor construction wherein all resistance and capacitance properties are controlled and three methods are provided for attaining the structure.

Having thus described my invention, what I claim as new and what I desire to secure by Letters Patent is:

1. In a bipolar transistor of the type having in a compound semiconductor body an exposed surface base layer over a buried layer forming a p-n junction therewith and with a smaller area epitaxial electrode forming a p-n junction with said base layer at said exposed surface, said epitaxial electrode extending a distance vertically with respect to said exposed surface,
   the intermediate manufacturing product comprising:
   said epitaxial electrode having an overhanging portion at the portion thereof separated from said exposed surface,
     said overhanging portion extending a specific lateral distance beyond the lateral extent of said electrode at contact with said exposed layer, and
   said base layer having a high conductivity portion,
     said high conductivity portion surrounding the area of contact of said epitaxial electrode with said base layer and terminating proximate to said epitaxial electrode by at most said specific distance.

2. The improvement of claim 1 wherein said epitaxial electrode is the collector electrode of said transistor and said buried layer is the emitter electrode of said transistor.

3. The improvement of claim 1 wherein said epitaxial electrode is the emitter electrode of said transistor and said buried layer is the collector electrode of said transistor.

4. The intermediate manufacturing product of claim 3 wherein said overhanging portion results from said emitter electrode having a trapezoidal shape with the smaller parallel side thereof in contact with said base layer.

5. The intermediate manufacturing product of claim 3 wherein said overhanging portion is a deposited material on the vertical sides of said emitter electrode.

6. The intermediate manufacturing product of claim 3 wherein said overhanging portion results from a separate layer positioned on and extending beyond the vertical sides of a two-epitaxial layer body of said emitter electrode.

7. A heterojunction bipolar transistor comprising in combination,
   a compound semiconductor monocrystalline body,
     said body having a larger area base electrode layer forming a p-n junction with a buried electrode layer and a smaller area epitaxial electrode forming a p-n junction with said base electrode layer on the other side thereof,
     said base electrode layer having an extrinsic portion of high conductivity surrounding and extending proximate to but separated from by a specific dimension, said smaller area electrode p-n junction periphery thereby defining an intrinsic base electrode area and a base electrode to buried electrode p-n junction area,
   a metal contact to said extrinsic portion of said base layer terminating at said specific dimension from said smaller area electrode,
   an isolation member in said body extending at least through said buried layer,
   an insulation layer surrounding said smaller area electrode, conformally covering said metal contact and having a planar surface flush with said small area electrode, and
   contact members positioned on said planar surface and providing a separate electrical connection to each of said small electrode, said metal contact and said buried electrode.

8. The transistor of claim 7 wherein said smaller area electrode is the emitter.

9. The transistor of claim 8 wherein said emitter is a trapezoid in shape.

10. The transistor of claim 8 wherein said base electrode layer is of p-AlGaAs, said buried layer is n-AlGaAs and said emitter is made up of a first n-AlGaAs layer adjacent said base layer and a second n$^+$-GaAs layer remote from said base layer.

* * * * *